United States Patent [19]

Machida

[11] Patent Number: 5,084,818
[45] Date of Patent: Jan. 28, 1992

[54] METHOD AND SYSTEM FOR FOURIER TRANSFORMING 3 DIMENSIONAL MR DATA IN PREDETERMINED POSITION OF INTEREST BY USING PHASE-CORRECTION IN MRI

[75] Inventor: Yoshio Machida, Tochigi, Japan

[73] Assignee: Kabushiki Kaisha Toshiba, Kawasaki, Japan

[21] Appl. No.: 361,159

[22] Filed: Jun. 5, 1989

[30] Foreign Application Priority Data

Jun. 7, 1988 [JP] Japan ................................ 63-139926

[51] Int. Cl.$^5$ ............................................. G01R 33/20
[52] U.S. Cl. .............................. 364/413.13; 324/307; 324/309
[58] Field of Search ................... 364/413.13; 324/307, 324/309, 320

[56] References Cited

U.S. PATENT DOCUMENTS

| 4,458,203 | 7/1984 | Young | 324/309 |
| 4,468,621 | 8/1984 | Hinshaw | 324/309 |
| 4,599,565 | 7/1986 | Hoenninger, III et al. | 324/309 |
| 4,665,366 | 5/1987 | Macovski | 324/309 |
| 4,706,027 | 11/1987 | Hughes | 324/309 |
| 4,713,614 | 12/1987 | Hoshino et al. | 324/307 |
| 4,716,368 | 12/1987 | Haacke | 324/309 |
| 4,720,679 | 1/1988 | Patrick et al. | 324/309 |
| 4,789,833 | 12/1988 | Nishimura | 324/320 |

Primary Examiner—Jerry Smith
Assistant Examiner—Russell E. Cass
Attorney, Agent, or Firm—Finnegan, Henderson, Farabow, Garrett, and Dunner

[57] ABSTRACT

In an MRI system, a region including a portion of interest is selectively excited in a predetermined pulse sequence to acquire 3 dimensional MR data. When the portion of interest is shifted from the center position of imaging, i.e., the center position of a gradient field, the 3 dimensional MR data is phase-corrected in accordance with the shift. The phase-corrected 3 dimensional MR data is 3-dimensional Fourier-transformed to obtain an MR image of a predetermined slice portion.

5 Claims, 8 Drawing Sheets

METHOD AND SYSTEM FOR FOURIER TRANSFORMING 3 DIMENSIONAL MR DATA IN PREDETERMINED POSITION OF INTEREST BY USING PHASE-CORRECTION IN MRI

BACKGROUND OF THE INVENTION

1. Field of the Invention

The present invention relates to a method and system for Fourier transforming 3 dimensional MR data in predetermined position of interest by using phase-correction in MRI (Magnetic resonance imaging).

2. Description of the Related Art

Figure 1:
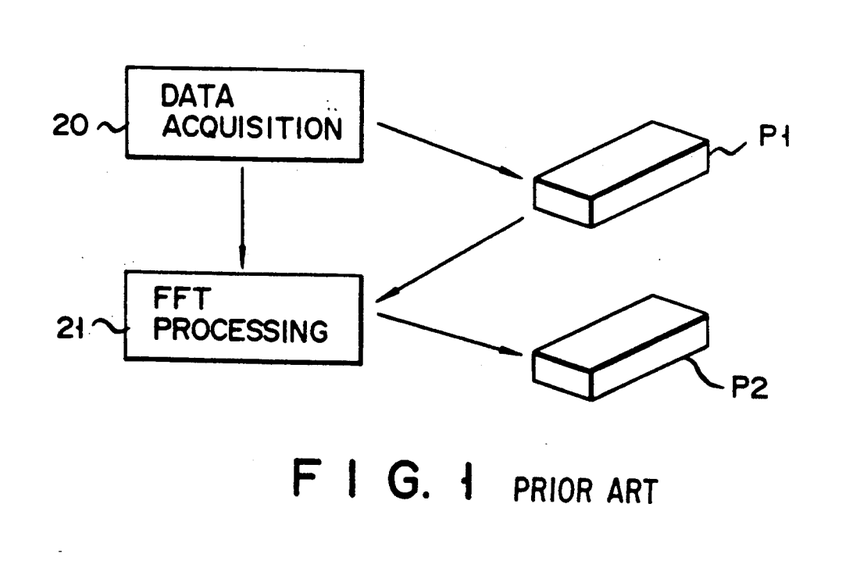
FIG. 1 is a chart for explaining conventional image reconstruction processing.
Figure 2:
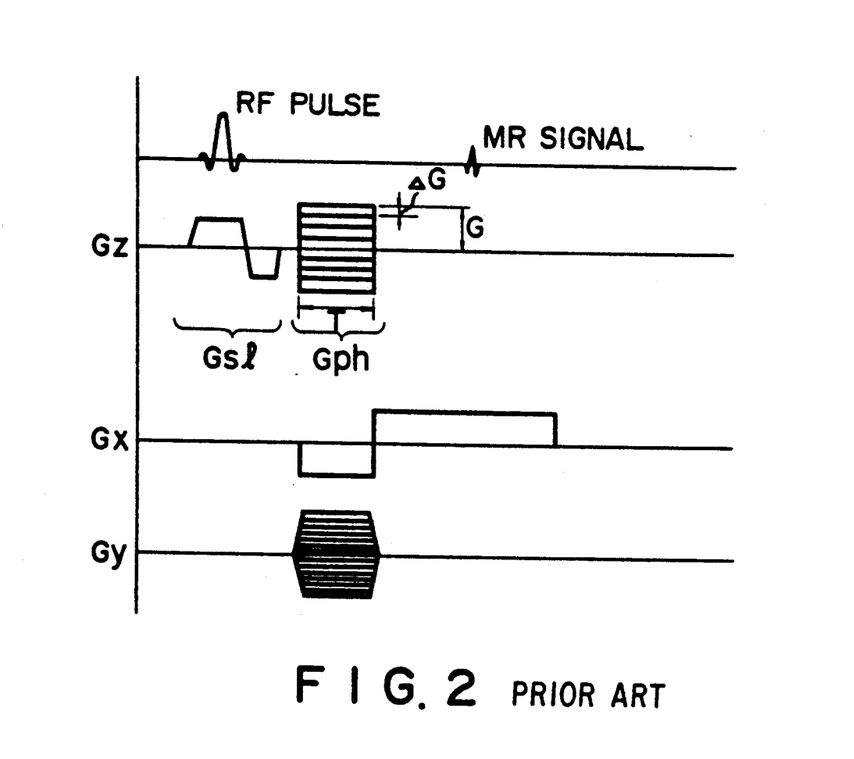
FIG. 2 is a chart showing a pulse sequence used for performing 3 dimensional Fourier transformation processing.

In conventional MRI, a data acquisition block 20 shown in FIG. 1 detects an MR signal generated in a 3 dimensional region of interest using a pulse sequence shown in FIG. 2 to obtain 3 dimensional MR data P1. The 3 dimensional MR data P1 is subjected to 3 dimensional FFT processing by an FFT (Fast Fourier transformation) processing block 21, thus acquiring a 3 dimensional MR image P2.

Figure 3:
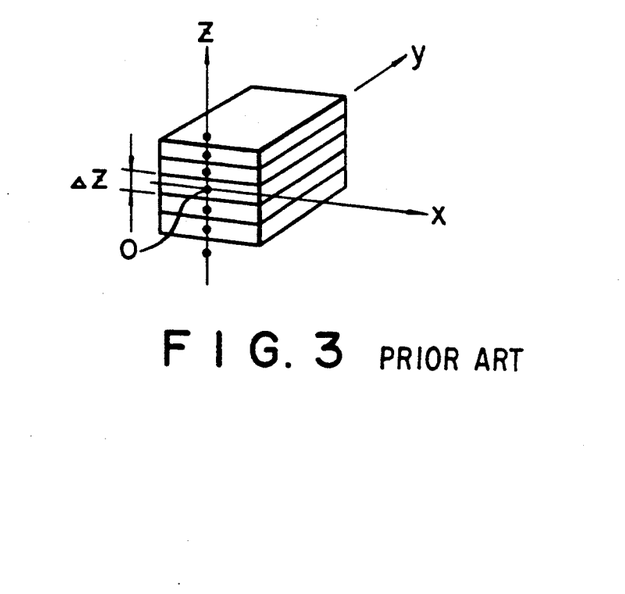
FIG. 3 is a view showing a coordinate system of 3 dimensional MR data.
Figure 4:
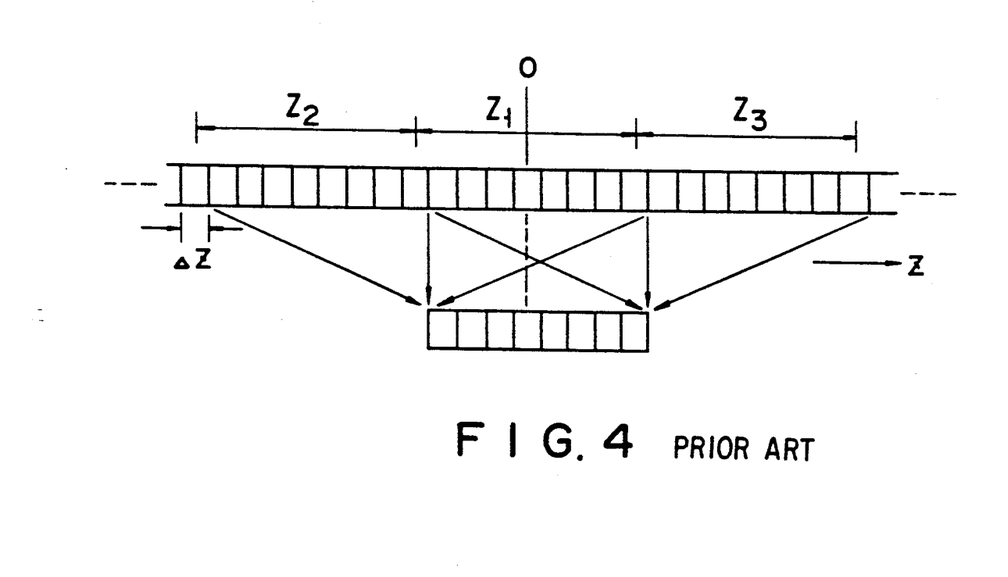
FIG. 4 is a chart for explaining aliasing when MR data of a region of interest is acquired.

Gx, Gy, and Gz in FIG. 2 represent gradient fields in a read direction (x-axis direction), an encoding direction (y-axis direction), and a slice direction (z-axis direction), respectively, as shown in FIG. 3. Note that the field Gz has a slice field Gsl and a phase-encoding field Gph. A 3 dimensional data matrix is represented by Nx×Ny×Nz, and Nz will be simply represented by N hereinafter.

If "resolution" in the z-axis direction is assumed by $\Delta z$ and "band" is assumed by Z, $\Delta z$ and Z are represented by the following expression using $\Delta G$, T, and G in the pulse sequence shown in FIG. 2.

$$\Delta z = 1/(N \cdot \Delta G \cdot T) = 1/(2 \cdot G \cdot T) \quad (1)$$

$$Z = 1/(\Delta G \cdot T) \quad (2)$$

Therefore, when this pulse sequence is used, aliasing occurs in the band Z as a period due to the characteristic of DFT (Discrete Fourier transformation).

As shown in FIG. 3, when a band Z2 having a center position O in the z-axis direction as a center is set as a region of interest, MR signals are also generated in adjacent bands Z2 and Z3. Therefore, an MR image in which adjacent MR images are partially superposed on a subject MR image is acquired. This is called "aliasing". When only the band Z1 is selectively excited, superposition between the adjacent MR images and the subject MR image can be prevented. However, when a portion of interest is present at a position shift from the center position of imaging, i.e., the center of a gradient field and 3 dimensional FFT processing is performed after the portion of interest is selectively excited, an MR image may be irregularly reconstructed or a slice slightly shifted from a predetermined slice may be reconstructed.

Thus, a demand has arisen for an apparatus which can obtain a 3 dimensional MR image on a predetermined slice without being influenced by aliasing in 3 dimensional Fourier transformation processing.

SUMMARY OF THE INVENTION

It is an object of the present invention to provide a method and system for Fourier transforming 3 dimensional MR data in predetermined position of interest by using phase-correction in MRI.

According to one aspect of the present invention, there is provided a method for Fourier transforming 3 dimensional MR data in a predetermined position of interest by using phase-correction in MRI, the method comprising the steps of:

acquiring the 3 dimensional MR data in a predetermined pulse sequence;

setting a distance between a position of interest and a center position of a gradient field, when the position of interest is shifted from the center position of a gradient field;

phase-correcting the acquired 3 dimensional MR data in accordance with the set distance; and Fourier-transforming the phase-corrected 3 dimensional MR data, thereby reconstructing a 3 dimensional MR image.

According to another aspect of the present invention, there is a system for Fourier transforming a 3 dimensional MR data in a predetermined position of interest by using phase-correction in MRI, the system comprising:

acquiring means for acquiring 3 dimensional MR data in a predetermined pulse sequence;

setting means for setting a distance between a position of interest and a center position of a gradient field, when the position of interest is shifted from the center position of the gradient field;

correcting means for phase-correcting the 3 dimensional MR data in accordance with the set distance; and transforming means for Fourier-transforming the phase-corrected 3 dimensional MR data, thereby reconstructing a 3 dimensional MR image.

DETAILED DESCRIPTION OF THE PREFERRED EMBODIMENTS

An embodiment of the present invention will now be described with reference to the accompanying drawings.

Figure 5:
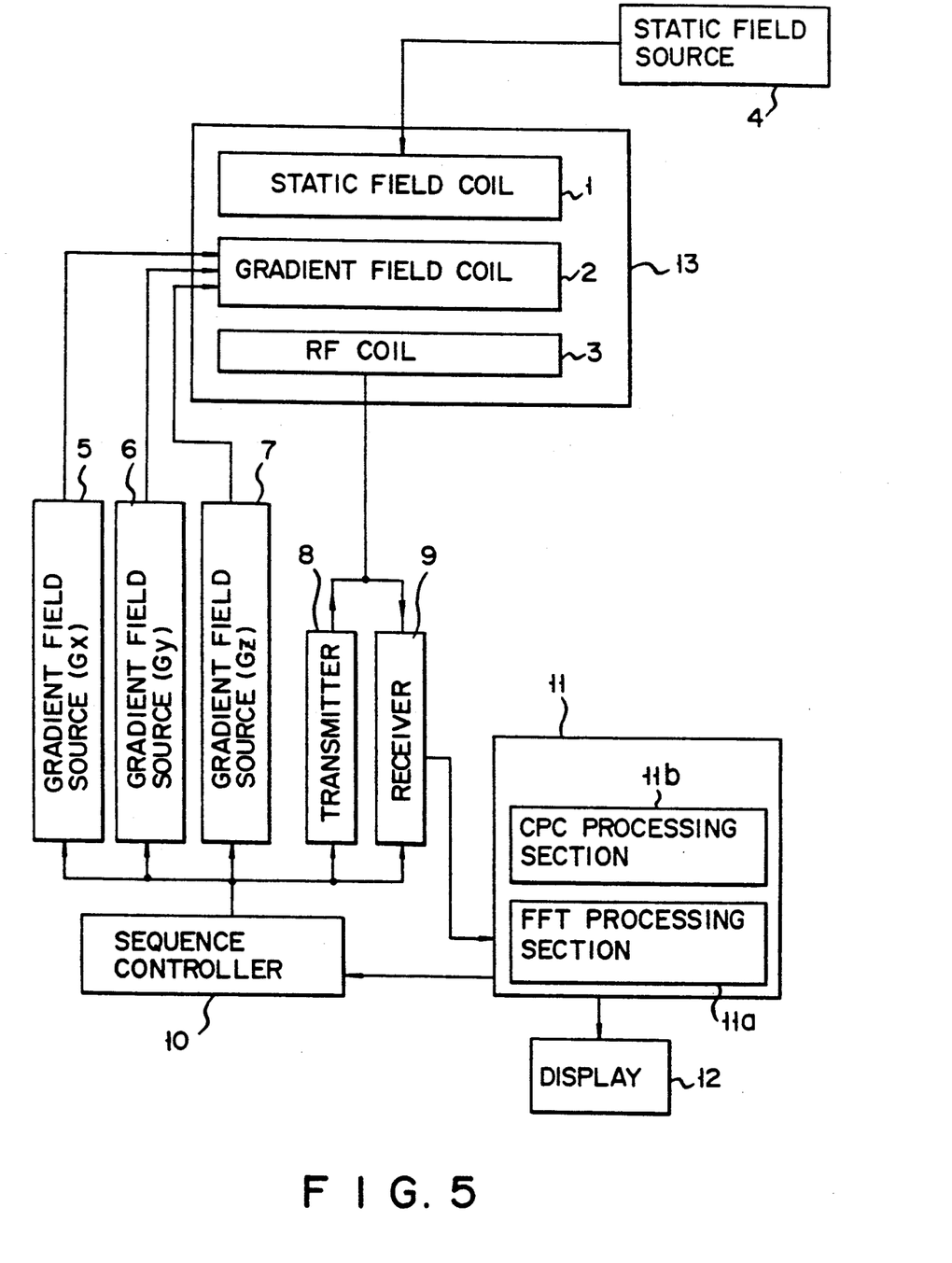
FIG. 5 is a block diagram showing an arrangement of an MRI system according to an embodiment of the present invention;.

In an MRI system as shown in FIG. 5, a coil system 13 in which a subject (not shown) can be placed has a static field coil 1 for generating a static field, a gradient field coil 2 for generating gradient fields in x-, y-, and z-axis directions to add position information to a predetermined portion of a subject from which an MR signal is generated, and an RF coil 3 for transmitting RF pulses and detecting an MR signal.

This MRI system has a static field source 4 for supplying a current to the static field coil 1, gradient field sources 5, 6, and 7 for supplying currents to the gradient field coil 2, a transmitter 8 for performing transmission control of RF pulses, a receiver 9 for performing reception control of an MR signal, a sequence controller 10 for executing a pulse sequence, a computer system 11 for controlling the sequence controller 10 and performing processing of a detected MR signal, and a display 12. Note that the computer system 11 is constituted by an FFT processing section 11a and a CPC (Centering phase correction) processing section 11b.

Figure 6:
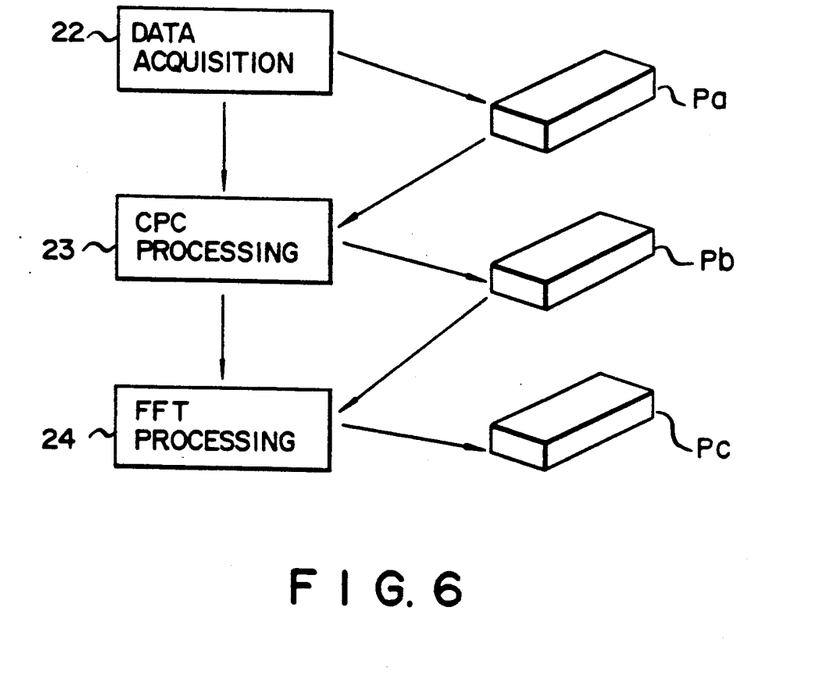
FIG. 6 is a chart for explaining image reconstruction processing in the embodiment of the present invention.

As shown in FIG. 6, an MR signal generated in a 3 dimensional region of interest using the pulse sequence shown in FIG. 2 is acquired by a data acquisition block 22 as 3 dimensional MR data Pa. As will be described later, when a portion of interest is shifted from the center position in the z-axis direction, a CPC processing block 23 phase-corrects the 3 dimensional MR data to cause the center of the portion of interest to coincide with the center position in the z-axis direction. An FFT processing block 24 executes 3 dimensional FFT processing to acquire a 3 dimensional MR image Pc on the basis of the phase-corrected 3 dimensional MR data Pb. The CPC processing block 23 and the FFT processing block 24 in FIG. 6 correspond to the CPC processing section 11b and the FFT processing section 11a shown in FIG. 5, respectively.

The operation of this system will be described below.

Figure 7:
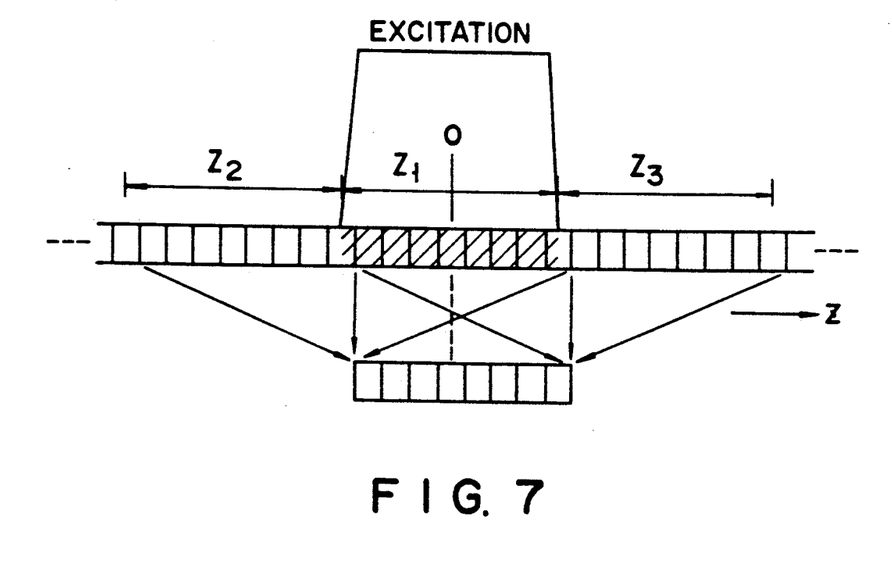
FIG. 7 is a chart for explaining acquisition of an MR image when a predetermined band is selectively excited.

When the acquired 3 dimensional MR data is subjected to 3 dimensional Fourier transformation processing as in the processing blocks in FIG. 1, aliasing occurs, as described above. As shown in FIG. 7, when a band Z1 having a center position O (z=0) of the z-axis as a center is selectively excited, aliasing can be prevented.

Figure 8A:
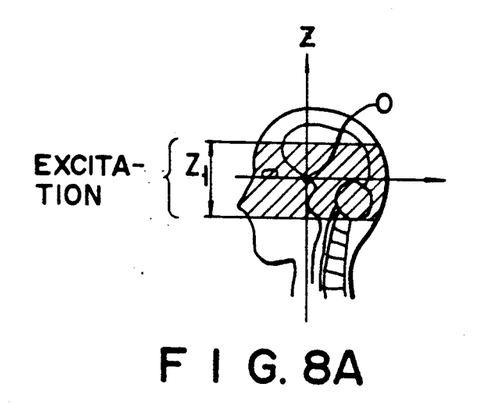
FIGS. 8A to 8C are views showing a selective excitation region of a subject to be examined and reconstructed MR images with or without selective excitation.
Figure 8B:
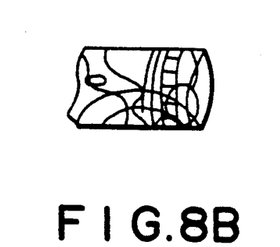
Figure 8C:
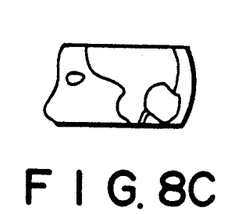

As shown in FIG. 8A, slicing is performed by selectively exciting the band Z1 having the center position O of a body axis (z-axis) of a subject as the center. When no selective excitation is performed, superposition of MR images occurs due to aliasing, as shown in FIG. 8B. However, when only the band Z1 is excited, superposition of MR images can be prevented, as shown in FIG. 8C.

Figure 9:
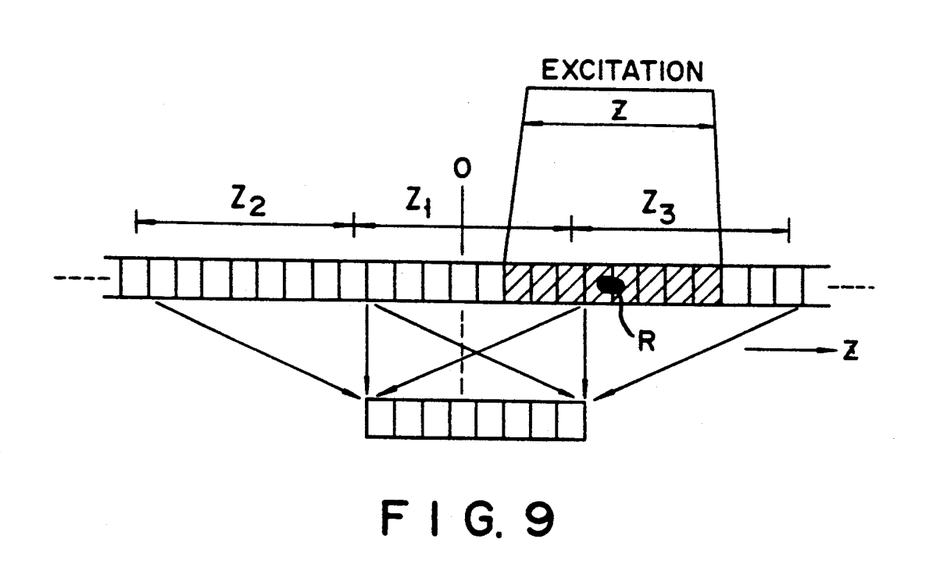
FIG. 9 is a chart for explaining acquisition of an MR image when the position of a portion of interest is shifted from the center position of a gradient field.
Figure 10A:
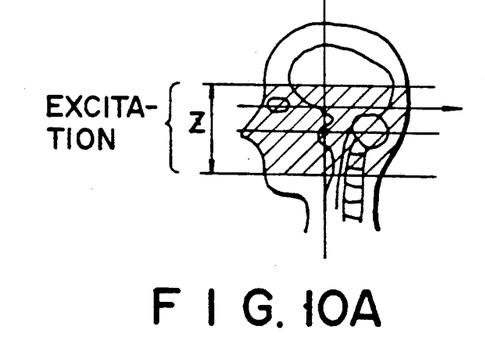
FIGS. 10A and 10B are views showing a selective excitation region of a subject to be examined and a reconstructed MR image in FIG. 9.
Figure 10B:
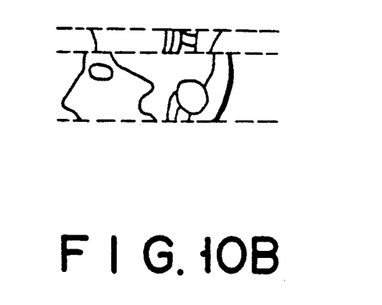

When a band Z including a portion of interest R shifted from the center position O of the z-axis is selectively excited, as shown in FIG. 9, an MR image is irregularly reconstructed although superposition of MR images caused by aliasing does not occur. When slicing is performed in the band Z, as shown in FIG. 10A, an irregularly reconstructed MR image is obtained although superposition of MR images does not occur, as shown in FIG. 10B.

Figure 11:
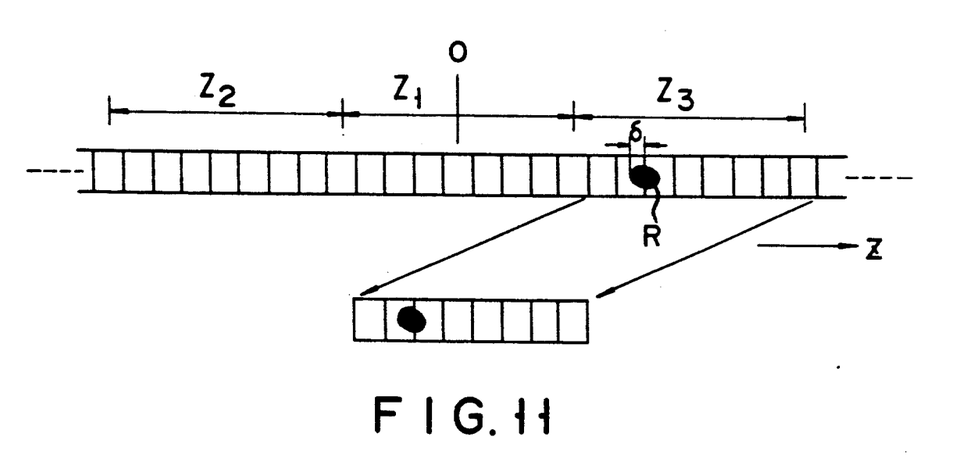
FIG. 11 is a chart for explaining acquisition of an MR image when the position of a portion of interest is shifted from the center position of a gradient field and is present between adjacent data.

As shown in FIG. 11, when the portion of interest R is shifted from the center position O of the z-axis and is located between adjacent data (shift δ occurs), a desired slice position does not coincide with an actually obtained slice position.

Figure 12:
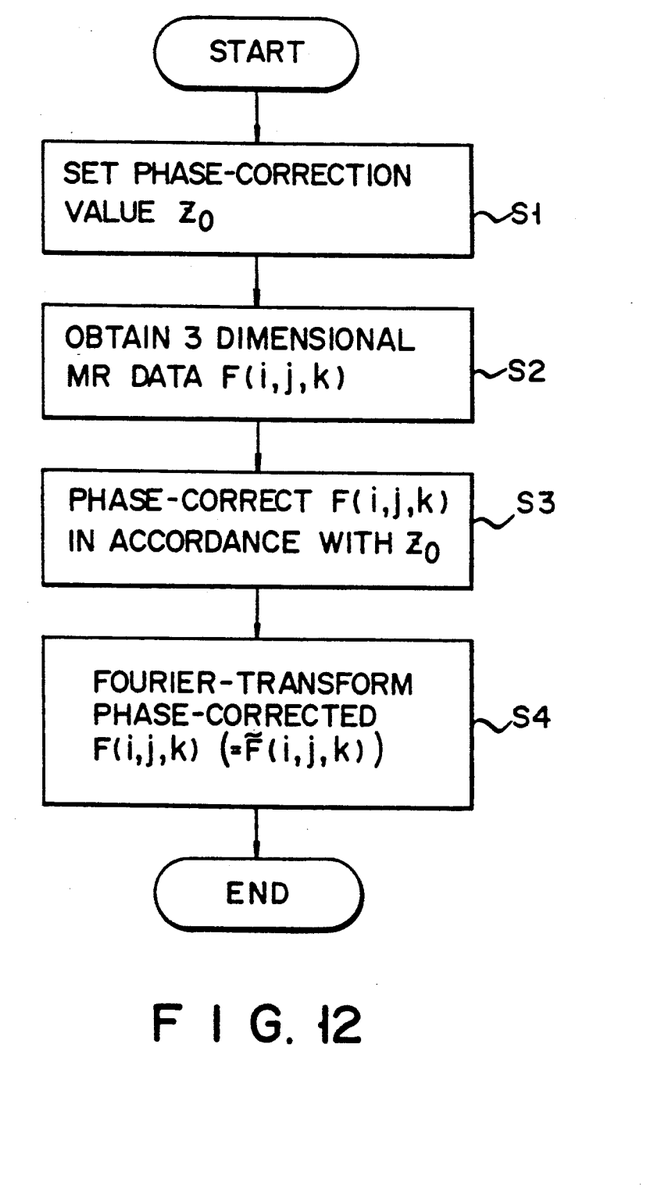
FIG. 12 is a flow chart of phase-correction processing according to the embodiment of the present invention.

In the system of this embodiment, CPC processing is performed according to the flow chart shown in FIG. 12.

Figure 13A:
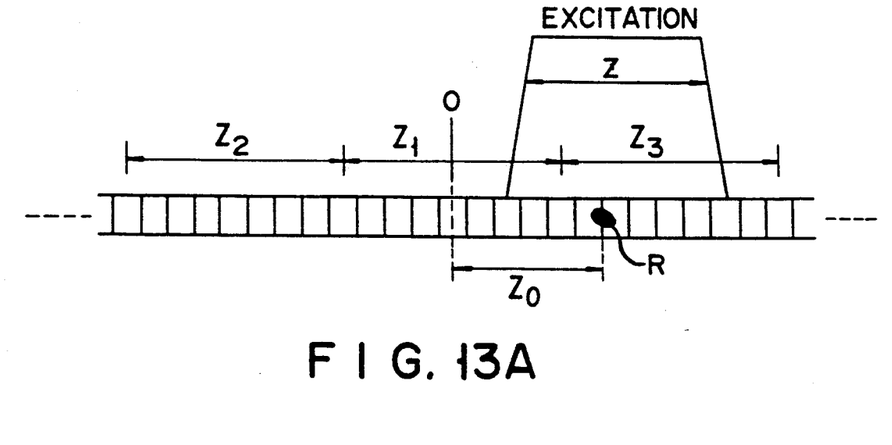
FIGS. 13A and 13B are charts for explaining acquisition of an MR image by the processing shown in FIG. 12 in the case of FIG. 11.
Figure 13B:
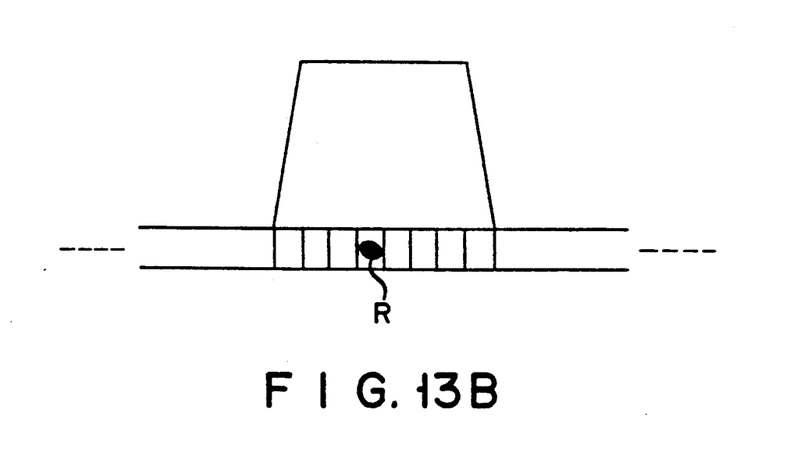

In step S1, a position $z_o$ representing a distance between the center position O and the portion of interest R is set, as shown in FIG. 13A. In step S2, the band Z including the portion of interest R is selectively excited to acquire 3 dimensional data F(i,j,k). In step S3, the 3 dimensional data F(i,j,k) is phase-corrected in accordance with the position $z_o$ to cause the portion of interest R to coincide with the center position O. In step S4, the phase-corrected 3 dimensional MR data F(i,j,k), i.e., $\tilde{F}$(i,j,k) is Fourier-transformed. Thus, a regularly reconstructed MR image can be acquired at a predetermined slice position, as shown in FIG. 13B.

The principle of the CPC processing will be mathematically described below.

More specifically, a function F(t) and its Fourier-transformed function f(x) are called a Fourier-transformation pair, and are expressed as In this case, the following relationship is established:

$$\exp(ix_o t) \cdot F(t) \quad\bigcirc\quad f(x - x_o) \tag{3}$$

That is, if $$f(x) = \int_{-\infty}^{\infty} F(t) \exp(-ixt) dt,$$

the following relationship is established:

$$\int_{-\infty}^{\infty} \exp(ix_o t) \cdot F(t) dt = \int_{-\infty}^{\infty} F(t) \exp\{-i(x - x_o)t\} dt \tag{4}$$
$$= f(x - x_o)$$

The above-mentioned relationship is applied to the z-axis direction.

$$F(i,j,k) \quad -Nx/2 + 1 \leq i \leq Nx/2$$
$$-Ny/2 + 1 \leq j \leq Ny/2$$
$$-Nz/2 + 1 \leq k \leq Nz/2$$

A data matrix is represented by Nx×Ny×Nz, and Nz is determined as a slice direction. In this case, CPC is expressed by the following equation:

$$\tilde{F}(i,j,k) = \exp(-iak) \cdot F(i,j,k) \tag{5}$$

for $a = 2\pi z_o / Z$ where $z_o$ is the distance between the center position O of the z-axis and the portion of interest R.

After the above-mentioned CPC processing, 3 dimensional FFT processing is performed, so that a regularly reconstructed 3 dimensional MR image can be acquired.

The specific embodiment of the present invention has been described. However, the present invention is not limited to the above embodiment, and various changes and modifications may be made within the spirit and scope of the invention.

What is claimed is:

1. A method for imaging 3 dimensional magnetic resonance (MR) data in a portion of interest of a subject by using phase-correction in a magnetic resonance imaging (MRI) apparatus, the method comprising the steps of:
   applying magnetic gradient fields to the subject;
   acquiring the 3 dimensional MR data by selectively exciting a region including the portion of interest of the subject in accordance with a predetermined pulse sequence;
   determining the distance between the portion of interest and a center position of a select one of said gradient fields;
   phase-correcting the acquired 3 dimensional MR data in accordance with the distance; and
   Fourier-transforming the phase-corrected 3 dimensional MR data, thereby reconstructing a 3 dimensional MR image.

2. The method according to claim 1, wherein the acquired 3 dimensional MR data $F(x,y,z)$ is phase-corrected by the following equation:

$$\tilde{F}(x,y,z) = exp(-iaz) F(x,y,z)$$

$$a = 2\pi zo / Z$$

where $\tilde{F}(x,y,z)$ is the phase-corrected 3 dimensional MR data, zo is the distance between the center position of the select gradient field and the portion of interest, and Z is a band corresponding to the region.

3. A system For imaging 3 dimensional magnetic resonance (MR) data in a portion of interest of a subject by using phase-correction in a magnetic resonance (MRI) apparatus, the system comprising:
   acquiring means for acquiring the 3 dimensional MR data by selectively exciting a region including the portion of interest in accordance with applied magnetic gradient fields and a predetermined pulse sequence;
   determining means for determining the distance between the portion of interest and a center position of a select one of said gradient fields;
   correcting means for phase-correcting the 3 dimensional MR data in accordance with the set distance; and
   correcting means for phase-correcting the 3 dimensional MR data in accordance with the set distance; and
   transforming means for Fourier-transforming the phase-corrected 3 dimensional MR data, thereby reconstructing a 3-dimensional MR image.

4. The system according to claim 3, wherein the acquired 3 dimensional MR data $F(x,y,z)$ is phase-corrected by the following equation:

$$F(x,y,z) = exp(-iaz) F(x,y,z)$$

$$a = 2\pi zo / Z$$

where $F(x,y,z)$ is the phase-corrected 3 dimensional MR data, zo is the distance between the center position of the select gradient field and the portion of interest, and Z is a band corresponding to the excited region.

5. The system according to claim 3, wherein the acquiring means includes:
   first generating means for generating a static field;
   second generating means for generating the gradient fields;
   applying and receiving means for applying a radio frequency pulse to a subject to be selectively excited and receiving an MR signal from the subject to obtain the 3 dimensional MR data; and
   control means for controlling the first named and second generating means and the applying and receiving means in accordance with the predetermined pulse sequence.

* * * * *

UNITED STATES PATENT AND TRADEMARK OFFICE
CERTIFICATE OF CORRECTION

PATENT NO. : 5,084,818
DATED : January 28, 1992
INVENTOR(S) : Yoshio Machida

It is certified that error appears in the above-identified patent and that said Letters Patent is hereby corrected as shown below:

Claim 3, column 5, line 43, change "For" to --for--.

Claim 3, column 6, lines 14, 15, 16, Delete in their entireties.

Claim 4, column 6, line 24, change "F(x,y,z)" (first occurence) to --$\tilde{F}(x,y,z)$--.

Claim 4, column 6, line 27, change "F(x,y,z)" to -- $\tilde{F}(x,y,z)$--.

Signed and Sealed this

Twenty-fourth Day of August, 1993

Attest:

BRUCE LEHMAN

*Attesting Officer*  *Commissioner of Patents and Trademarks*